United States Patent
Li et al.

(10) Patent No.: US 7,802,171 B2
(45) Date of Patent: Sep. 21, 2010

(54) WIRELESS COMMUNICATION METHOD AND SYSTEM FOR BIT INTERLEAVED CODED MODULATION AND ITERATIVE DECODING

(75) Inventors: Yingxue Li, Exton, PA (US);
Prabhakar R. Chitrapu, Blue Bell, PA (US)

(73) Assignee: InterDigital Technology Corporation, Wilmington, DE (US)

( * ) Notice: Subject to any disclaimer, the term of this patent is extended or adjusted under 35 U.S.C. 154(b) by 936 days.

(21) Appl. No.: 11/617,013

(22) Filed: Dec. 28, 2006

(65) Prior Publication Data

US 2007/0260958 A1 Nov. 8, 2007

Related U.S. Application Data

(60) Provisional application No. 60/771,515, filed on Feb. 8, 2006.

(51) Int. Cl.
*H03M 13/03* (2006.01)
(52) U.S. Cl. .................................................. 714/790
(58) Field of Classification Search ................ 714/786, 714/790, 794
See application file for complete search history.

(56) References Cited

U.S. PATENT DOCUMENTS

| | | | | |
|---|---|---|---|---|
| 6,044,116 | A * | 3/2000 | Wang | 375/265 |
| 6,185,258 | B1 | 2/2001 | Alamouti et al. | |
| 7,613,243 | B2 * | 11/2009 | Ouyang et al. | 375/260 |
| 2005/0122896 | A1 * | 6/2005 | Song et al. | 370/210 |
| 2006/0036924 | A1 * | 2/2006 | Ghosh | 714/755 |
| 2006/0104379 | A1 * | 5/2006 | Li et al. | 375/267 |

OTHER PUBLICATIONS

Song et al., Rate compatible punctured convolutionally (RCPC) space frequency bit interleaved coded modulation (SF-BICM), 2004. IEEE, Comm. Society, p. 3284-3288.*
McLay et al., Layered space frequency bit interleaved coded modulation for MIMO systems, 2005, IEEE, p. 1106-1110.*
Alamouti, A Simple Transmit Diversity Technique for Wireless Communications, *IEEE Journal on Select Areas in Communications*, vol. 16, No. 8, pp. 1451-1458, (Oct. 1998).
Benedetto et al., A Soft-output APP Module for Iterative Decoding of Concatenated Codes, *IEEE Communication Letters*, vol. 1, No. 1, pp. 22-24, (Jan. 1997).
Li et al., Bit-Interleaved Coded Modulatio With Iterative Decoding Using Soft Feedback, *Electronics Letters*, vol. 34, No. 10, pp. 942-943, (May 14, 1998).

* cited by examiner

*Primary Examiner*—Shelly A Chase
(74) *Attorney, Agent, or Firm*—Volpe and Koenig, P.C.

(57) ABSTRACT

A wireless communication method and system for performing bit-interleaved coded modulation and iterative decoding. The system includes a transmitter and a receiver. The transmitter encodes incoming bits to generate coded bits, punctures the coded bits in accordance with a predetermined puncturing pattern to generate surviving channel bits and stolen bits and interleaves the surviving bits into interleaved surviving bits. The interleaved surviving bits are mapped to channel symbols and the stolen bits are interleaved to generate interleaved stolen bits. At least one of a plurality of antennas is selected to transmit the channel symbols based on the value of the interleaved stolen bits. The receiver receives the transmitted channel symbols, estimates a posteriori probability for both the channel symbols and the stolen bits, and retrieves information of the stolen bits by determining the selected antenna used to transmit the channel symbols.

14 Claims, 4 Drawing Sheets

WIRELESS COMMUNICATION METHOD AND SYSTEM FOR BIT INTERLEAVED CODED MODULATION AND ITERATIVE DECODING

CROSS REFERENCE TO RELATED APPLICATION

This application claims the benefit of U.S. Provisional Application No. 60/771,515 filed Feb. 8, 2006, which is incorporated by reference as if fully set forth.

FIELD OF INVENTION

The present invention is related to multiple-input multiple-output (MIMO) technology in wireless communication systems. More particularly, the present invention is related to a method and system for bit-interleaved coded modulation and iterative decoding.

BACKGROUND

Demand for high data rates has been driving development and standardization efforts for next generation wireless systems, such as evolved universal terrestrial radio access (E-UTRA) and IEEE 802.11n. To achieve high data rates, high-rate channel coding and higher order modulation are needed, which often causes less reliable transmission. One remedy for this is using transmit diversity, such as space-time block code (STBC).

Figure 1:
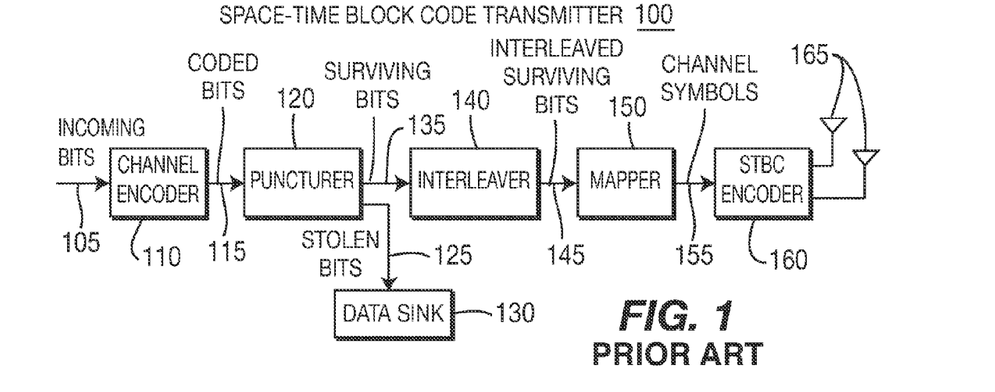
FIG. 1 is a block diagram of a conventional transmitter employing STBC.

FIG. 1 is a block diagram of a conventional transmitter 100 employing STBC. Incoming bits 105 are coded by a channel encoder 110. The output 115 of the channel encoder 110, (i.e., coded bits), are passed to a puncturer 120, where some bits are deleted, (i.e., punctured), according to a predetermined puncturing pattern. The deleted bits are often referred to as "stolen" bits 125 and are not transmitted to a receiver in any form. The stolen bits are placed in a data sink 130, (which is merely a conceptual component), for disposal. The surviving bits 135 are interleaved by an interleaver 140, to avoid burst errors. The interleaved surviving bits 145 are then mapped to channel symbols 155 by a mapper 150, such as quadrature phase shift keying (QPSK), or 16 quadrature amplitude modulation (16 QAM), or the like. The channel symbols 155 are finally coded by an STBC encoder 160 and transmitted over the air via antennas 165. STBC provides full diversity at the symbol level, but it does not provide additional coding gain.

SUMMARY

The present invention is related to a wireless communication method and system for performing bit-interleaved coded modulation and iterative decoding. The system includes a transmitter and a receiver. The transmitter uses multiple antennas to transmit data with coded binary bits divided into two groups: surviving channel bits and "stolen", (i.e., punctured), bits. The transmitter encodes incoming bits to generate coded bits, punctures the coded bits in accordance with a predetermined puncturing pattern to generate surviving channel bits and stolen bits, and interleaves the surviving bits into interleaved surviving bits. The interleaved surviving bits are mapped to channel symbols and the stolen bits are interleaved to generate interleaved stolen bits. At least one of a plurality of antennas is selected to transmit the channel symbols based on the value of the interleaved stolen bits. The receiver receives the transmitted channel symbols, estimates a posteriori probability for both the channel symbols and the stolen bits, and retrieves information of the stolen bits by determining the selected antenna used to transmit the channel symbols.

The surviving channel bits are interleaved to avoid burst errors before being mapped into channel symbols and transmitted over the air. To achieve a high data rate, stolen bits are not transmitted over the air as in the prior art. In accordance with the present invention, the stolen bits are used as index to switch between transmit antennas or beams. Thus, information on stolen bits is implicitly passed to the receiver. The receiver uses a soft-in-soft-out (SISO) demapper to retrieve information of stolen bits by estimating which antenna was used to transmit channel symbols. The retrieved stolen bit information is then passed to a SISO decoder, along with surviving channel bit information. The output of the SISO decoder is then fed back to the SISO demapper. The iterative process continues until convergence or a pre-determined iteration number is reached. With more iterations, the reliability of stolen bit information increases, which ultimately improves performance of the SISO decoder.

BRIEF DESCRIPTION OF THE DRAWINGS

A more detailed understanding of the invention may be had from the following description of a preferred embodiment, given by way of example and to be understood in conjunction with the accompanying drawings wherein.

DETAILED DESCRIPTION OF THE PREFERRED EMBODIMENTS

When referred to hereafter, the terminology "wireless transmit/receive unit (WTRU)" includes but is not limited to a user equipment (UE), a mobile station, a fixed or mobile subscriber unit, a pager, a cellular telephone, a personal digital assistant (PDA), a computer, or any other type of user device capable of operating in a wireless environment.

When referred to hereafter, the terminology "base station" includes but is not limited to a Node-B, a site controller, an access point (AP) or any other type of interfacing device capable of operating in a wireless environment.

The features of the present invention may be incorporated into an integrated circuit (IC) or configured in a circuit comprising a multitude of interconnecting components.

The present invention is related to a method of reusing "stolen", (i.e., punctured or deleted), bits output from a puncturer and an iterative decoding method. The present invention achieves a similar diversity gain as STBC, but has a better coding gain by retrieving information from stolen bits. The present invention improves robustness of high data rate transmission and has better performance than prior art methods. One of the benefits of the present invention is randomization of co-channel interference to other users since signals are transmitted over different antennas and the pattern of antenna switching is pseudo random to other users.

Figure 2:
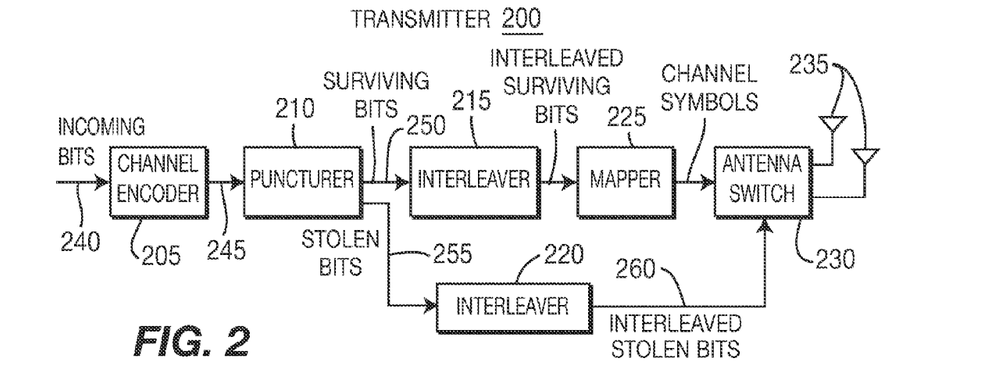
FIG. 2 is a block diagram of a transmitter configured in accordance with one embodiment of the present invention.

FIG. 2 is a block diagram of a transmitter 200 configured in accordance with one embodiment of the present invention. The transmitter 200 includes a channel encoder 205, a puncturer 210, a first interleaver 215, a second interleaver 220, a mapper 225, an antenna switch 230 and a plurality of transmit antennas 235. Although only two antennas 235 are shown in FIG. 2, it should be understood that any number of antennas 235 may be used in accordance with the present invention.

As shown in FIG. 2, incoming bits 240 are coded by the channel encoder 205. The coded bits 245 are passed to the puncturer 210, where some bits are deleted according to a predetermined puncturing pattern. The surviving bits 250 are interleaved by the first interleaver 215 and mapped to a symbol by the mapper 225. The stolen bits 255 are interleaved by the second interleaver 220. It should be noted that the puncturer 210 and the first interleaver 215 may be switched by properly designing the interleaving and puncturing pattern.

The operation of the antenna switch 230 is controlled by interleaved stolen bits 260 which are output from the second interleaver 220. For example, a first one of the antennas 235 is used to transmit a current channel symbol when the corresponding stolen bit value is "0" (zero), and a second one of the antennas 235 is used to transmit a current channel symbol when the stolen bit value is "1" (one). The antenna switch 230 may be a physical antenna switch or an antenna beam switch. If an antenna beam switch is used, for example, symbols "x" and "x" are simultaneously transmitted from the first and second antennas 235, respectively, when the stolen bit value is "0", and symbols "x" and "−x" are simultaneously transmitted from the first and second antennas 235, respectively, when the stolen bit value is "1".

Figure 3:
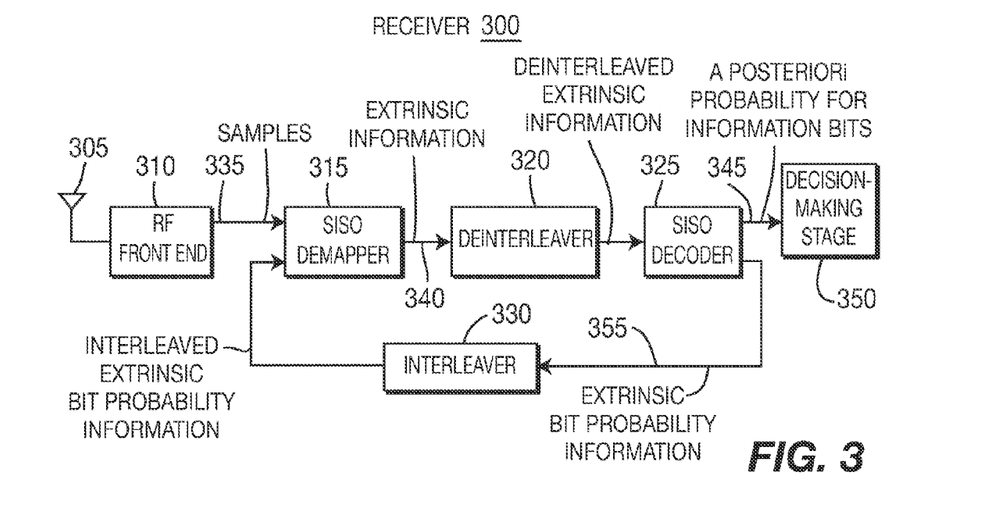
FIG. 3 is a block diagram of a receiver configured in accordance with the present invention.

FIG. 3 is a block diagram of a receiver 300 configured in accordance with the present invention. The receiver 300 includes an antenna 305, a radio frequency (RF) front end 310, a SISO demapper 315, a deinterleaver 320, a SISO decoder 325 and an interleaver 330. Signals received by the antenna 305 are processed by the RF front end 310 to generate samples 335. The samples 335 are fed into the SISO demapper 315, where a posteriori probability is estimated for both surviving channel bits and stolen bits. The SISO demapper 315 retrieves information of the stolen bits by estimating which antenna of the transmitter 200 was used to transmit the channel symbols. Also fed into the SISO demapper 315 is a priori probability of surviving channel bits and stolen bits, (i.e., the interleaved extrinsic bit probability information outputted by the interleaver 330 in the second iteration and beyond), which are set to zero in the first iteration and are passed from the SISO decoder 325 from the second iteration and beyond. The SISO demapper 315 calculates and outputs extrinsic information 340 of both channel and stolen bits by subtracting a priori probability from a posteriori probability. The extrinsic information 340 is deinterleaved by the deinterleaver 320 and passed to the SISO decoder 325, where a coding structure is utilized to refine information on both channel and stolen bits.

Two types of information are output by the SISO decoder 325: a posteriori probability for information bits 345 which is sent to a decision-making stage 350, and extrinsic bit probability information 355 which is interleaved by the interleaver 330 and fed back to the SISO demapper 315 for the next iteration.

Although other implementations are available under similar principle, one example of detailed operation of the SISO demapper 315 is explained hereinafter. For the sake of simplicity, reference to a time index is removed from the following description.

The transmitter 200 of FIG. 2 transmits channel symbols to the receiver 300 of FIG. 3. Referring to FIG. 2, let $\lfloor u^1, u^2, \ldots, u^k \rfloor$ be input to the channel encoder 205 of the transmitter 200, and $\lfloor c^1, c^2, \ldots, c^n \rfloor$ be output of the channel encoder 205. The output of the channel encoder 205 is punctured and interleaved. Let $\bar{t} = [t^1, t^2, \ldots, t^m]$ be interleaved surviving channel bits that are to be mapped to a channel symbol, and let $\bar{s} = [s^1, s^2, \ldots, s^L]$ be stolen bits associated with the channel symbol. The mapper 225 of the transmitter 200 maps surviving channel bits into channel symbols, preferably according to Gray mapping $x = \mu(\bar{t})$. A reverse mapping function is also defined as $t^i = \mu_i^{-1}(x)$. Similarly, an antenna mapping function is defined as $g = \eta(\bar{s})$ and corresponding inverse mapping $s^i = \eta_i^{-1}(g)$ is defined. Finally, channel symbol subsets $X_i^0 = \{x; \mu_i^{-1}(x) = 0\}$ and $X_i^1 = \{x; \mu_i^{-1}(x) = 1\}$, and antenna mapping index subsets $G_i^0 = \{g; \eta_i^{-1}(g) = 0\}$ and $G_i^1 = \{g; \eta_i^{-1}(g) = 1\}$ are defined.

For the sake of simplicity, a receiver 300 with a single antenna 305, as shown in FIG. 3, is explained without losing the essence of the present invention. The extension to multiple receive antenna systems is straightforward. Let $H = [h_1, h_2, \ldots, h_L]$ be a channel response vector, where $h_l$ is channel response from $l^{th}$ transmit antenna to the receive antenna. A flat channel model is assumed, which is generally valid from narrow band communication and also valid for each subcarrier of OFDM(A) systems. The digitized version of the receiver signal, which is sent to the SISO demapper 315 of the receiver 300, can be expressed as follows:

$$y = h_g x + \gamma,\qquad\text{Equation (1)}$$

where $\gamma$ is noise term. The SISO demapper 315 calculates a posteriori probability of both channel and stolen bits. A posteriori probability of surviving channel bits is calculated as follows, (after ignoring constant factors):

$$P(t^i = b \mid y) = \sum_{x \in X_i^b} P(y \mid x) P(x); \qquad\text{Equation (2)}$$

where:

$$P(y \mid x) = \sum_{g} P(y \mid x, h_g) P(g); \qquad\text{Equation (3)}$$

where:

$$P(y \mid x, h_g) = \exp\left(-\frac{|y - h_g x|^2}{2\sigma^2}\right). \qquad\text{Equation (4)}$$

P(x) and P(g) in Equations (2) and (3) are a priori probability. Equal probability is assumed in the first iteration and use an extrinsic bit probability from the SISO decoder 325 of the receiver 300 after the first iteration.

The extrinsic a posteriori probability of surviving channel bits for the second iteration and beyond is as follows:

$$P(t^i = b; O) = P(t^i = b \mid y) / P(t^i = b; I) = \qquad\text{Equation (5)}$$

$$\sum_{x \in X_i^b} \sum_{g} P(y \mid x, h_g) \prod_{j \neq i} P(t^j = \mu_i^{-1}(x); I)$$

$$\prod_{l} P(s^l = \eta_i^{-1}(g); I).$$

Similarly, the extrinsic a posteriori probability of stolen bits is calculated as follows:

$$P(s^i = b; O) = P(s^i = b \mid y)/P(s^i = b; I) = \sum_{x}\sum_{g \in G_i^b} P(y \mid x, h_g) \prod_j P(t^j = \mu_i^{-1}(x); I) \prod_{j \neq i} P(s^j = \eta_i^{-1}(g); I).$$

Equation (6)

The extrinsic a posteriori probability of both surviving channel bits and stolen bits are deinterleaved by the deinterleaver 320 and passed to the SISO decoder 325.

While the receiver 300 shown in FIG. 3 achieves optimum performance, suboptimum receivers may be used. One of the suboptimum receivers may be a decision feedback receiver, where hard decisions on both surviving channel bits and stolen bits are obtained and used in the next iteration as if they were known. It is assumed that channel state information is known to the receiver. However, it is also possible to apply blind detection approach where channel state information is unknown to the receiver.

Figure 4:
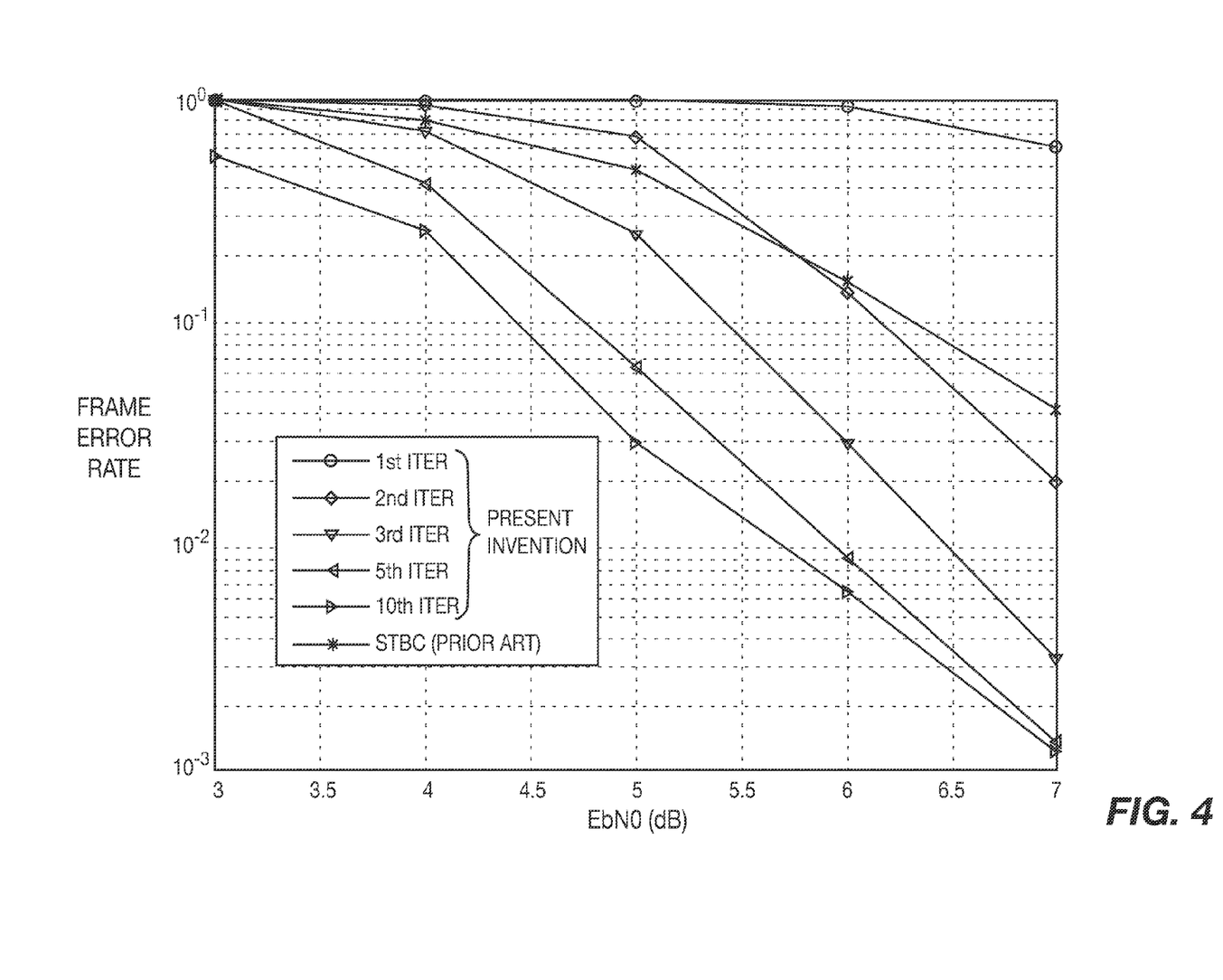
FIG. 4 shows an example of simulation comparison results in accordance with the present invention.

FIG. 4 shows an example of simulation comparison results in terms of frame error rate versus a ratio of energy per information bit verses noise spectrum density (EbN0) when comparing the transmitter 200 of FIG. 2 with the conventional STBC transmitter 100 of FIG. 1. In this example, channel codes are rate ½ convolutional code with a polynomial generator. The coded bits are punctured to rate ¾ in accordance with IEEE 802.11a/g. Each data frame has 576 information bits. The interleaver used has a depth of 24. The channel model used is fast flat Rayleigh fading. As illustrated by FIG. 4, with more iterations, a receiver would have a better estimation of stolen bits, and achieve better overall performance when a signal is received from the transmitter 200 of FIG. 2 in lieu of the STBC transmitter 100 of FIG. 1. When compared to the prior art STBC transmitter 100 of FIG. 1, the second iteration of the transmitter 200/receiver 300 outperforms at a higher signal-to-noise ratio (SNR) regime. At the tenth iteration, the transmitter 200 of FIG. 2 outperforms the conventional STBC transmitter 100 by about 2 dB at a 5% frame error rate.

Figure 5A:
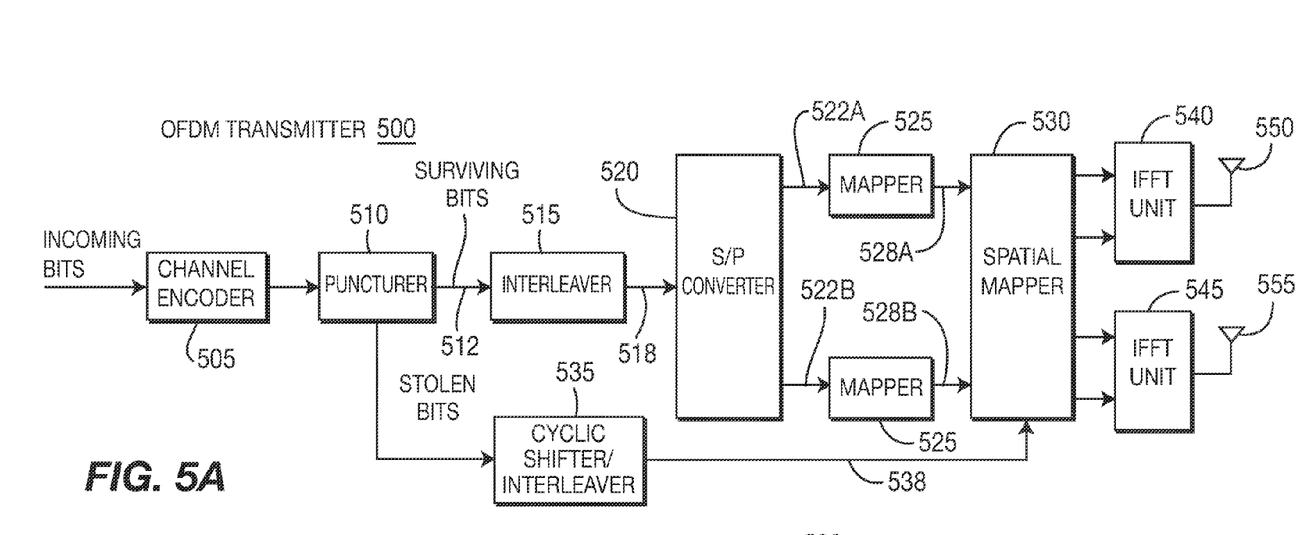
FIG. 5A is a block diagram of an orthogonal frequency division multiplexing (OFDM) transmitter configured in accordance with another embodiment of the present invention.

FIG. 5A is a block diagram of an OFDM transmitter 500 configured in accordance with another embodiment of the present invention. The OFDM transmitter 500 includes a channel encoder 505, a puncturer 510, an interleaver 515, a serial to parallel (S/P) converter 520, a plurality of mappers 525, a spatial mapper 530, a cyclic shifter/interleaver 535, a first inverse fast Fourier transform (IFFT) unit 540, a second IFFT unit 545, and antennas 550 and 555. Although only one of each of antennas 550 and 555 are shown in FIG. 5A, it should be understood that any number of antennas 550 and 555 may be used in accordance with the present invention. Incoming bits are coded by the channel encoder 505. The coded bits are passed to the puncturer 510, where some bits are deleted according to a predetermined puncturing pattern. The surviving bits 512 are interleaved by the interleaver 515. It should be noted that the puncturer 510 and the interleaver 515 may be switched by properly designing the interleaving and puncturing pattern. The interleaved bits 518 are converted into a plurality of parallel substreams 522A and 522B, (only two of which are shown by way of example), by the S/P converter 520.

In OFDM systems, each substream 522A and 522B corresponds to a subcarrier. Thus, the number of substreams is determined by number of subcarriers of an OFDM communication system. Bits on each substream 522A and 522B are mapped by the mappers 525 to a respective channel symbol 528A and 528B. The stolen bits 538 are fed to the spatial mapper 530 after being cyclic-shifted and interleaved by the cyclic shifter/interleaver 535. The stolen bits 538 are used to map the channel symbol streams into spatial streams, on a subcarrier by subcarrier basis.

Figure 5B:
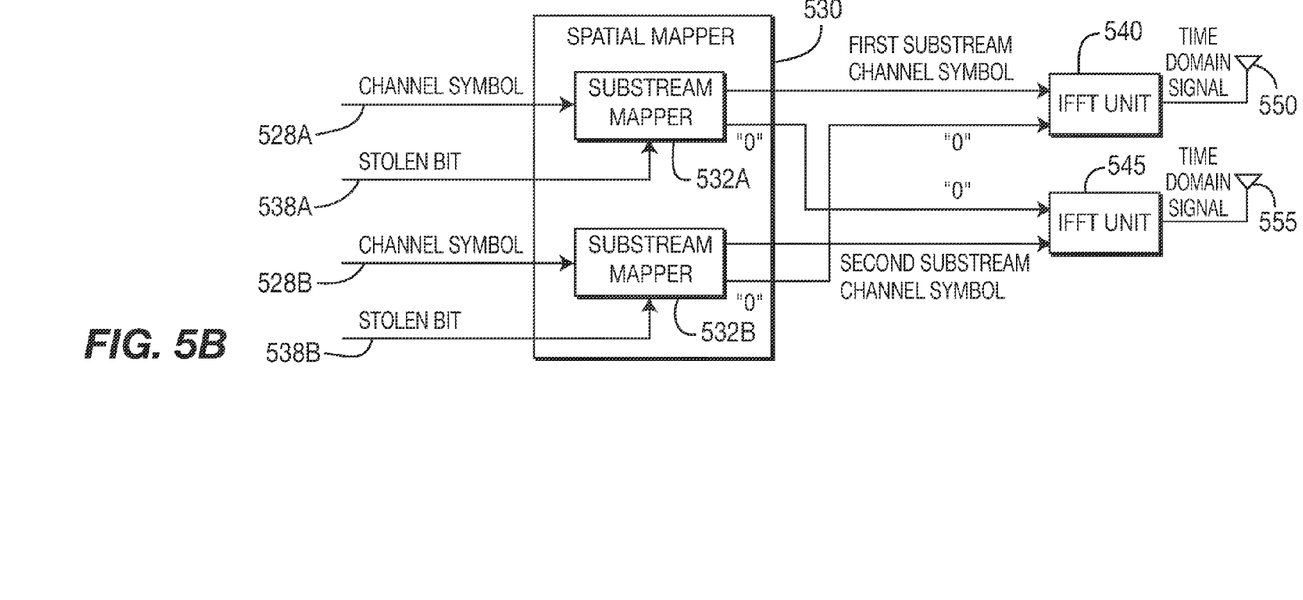
FIG. 5B shows an example of an operation performed by a spatial mapper used in the OFDM transmitter of FIG. 5A.

FIG. 5B shows an example of an operation performed by the spatial mapper 530 used in the OFDM transmitter 500 of FIG. 5A. The spatial mapper 530 includes a first substream mapper 532A and a second substream mapper 532B. Each substream mapper 532 associates a channel symbol 528 of each substream 522 with a stolen bit 538. Each channel symbol 528 is mapped to a respective one of the spatial streams according to the value of the stolen bit 538 associated with the channel symbol 528. A "0" (zero) is inserted in the other spatial stream of that substream.

As shown in FIG. 5B, the value of a stolen bit 538A assigned to the first substream is equal to "1" (one). Therefore, the channel symbol 528A on the first substream is sent to the IFFT unit 540 of the first spatial stream. In the meantime, a "0" is sent to the second spatial stream as a placeholder on the first substream. Similarly, the value of a stolen bit 538B assigned to the second substream is equal to "0". Therefore, the channel symbol 528B on the second substream is sent to IFFT unit 545 of the second spatial stream, and a "0" is sent to the first spatial stream as a placeholder on the second substream.

All of the substreams of a spatial stream, including "0" substreams, are converted into a time domain signal by each of the IFFT units 540 and 545. The time domain signals are finally transmitted over the air using the antennas 550 and 555. Although only one of each of antennas 550 and 555 are shown in FIG. 5B, it should be understood that any number of antennas 550 and 555 may be used in accordance with the present invention.

The performance advantage over STBC should be similar to narrow band systems. An additional benefit of the present invention in OFDM systems is that a peak-to-average ratio is reduced because in each spatial stream, some of subcarriers will be empty, so effective number of subcarriers is reduced.

Figure 6:
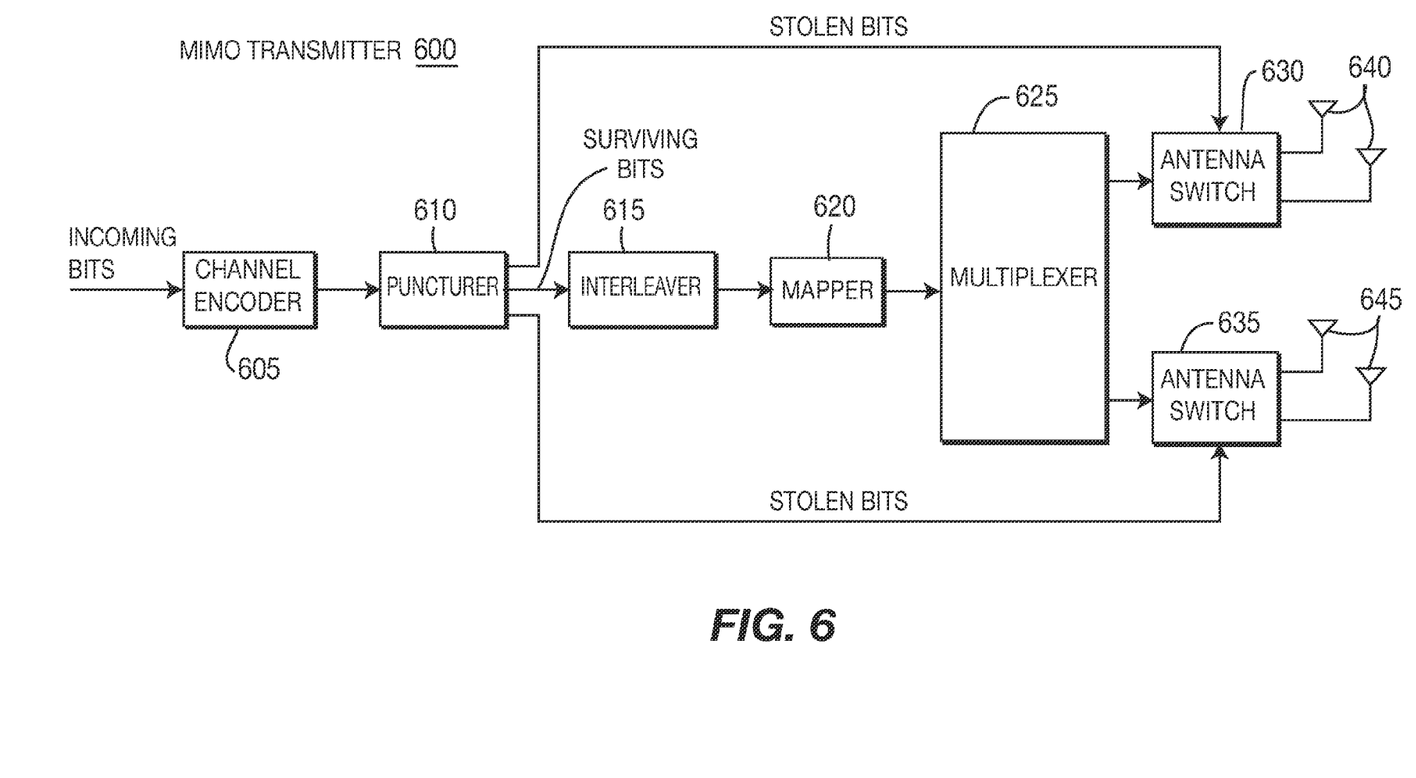
FIG. 6 is a block diagram of a multiple-input multiple-output (MIMO) transmitter configured in accordance with yet another embodiment of the present invention.

FIG. 6 is a block diagram of a MIMO transmitter 600 configured in accordance with yet another embodiment of the present invention. The MIMO transmitter 600 includes a channel encoder 605, a puncturer 610, an interleaver 615, a mapper 620, a multiplexer 625, antenna switches 630 and 635, and antennas 640 and 645. Although only two of each of antennas 640 and 645 are shown in FIG. 6, it should be understood that any number of antennas 640 and 645 may be used in accordance with the present invention. Incoming bits are coded by the channel encoder 605. The coded bits are passed to the puncturer 610, where some bits are deleted according to a predetermined puncturing pattern. The surviving bits are interleaved by the interleaver 615. It should be noted that the puncturer 610 and the interleaver 615 may be switched by properly designing the interleaving and puncturing pattern. The surviving bits are interleaved by the interleaver 615 and mapped by the mapper 620 into channel symbols. The stolen, (i.e., punctured), bits are fed into the antenna switches 630 and 635. The symbol stream output by the mapper 620 is then split into multiple, (for example, two substreams as shown in FIG. 6), streams by the multiplexer 625 and transmitted over the air from separate antennas 640 and 645 simultaneously. Different than conventional MIMO systems, stolen bits from the puncturer 610 are used by the antenna switches 630 and 635 to select an antenna 640 and 645 for each data stream.

In accordance with the present invention, antenna selection is used to add extra redundancy to data transmission in order to improve the data link. However, application of data dependent antenna selection is not limited to data link improvement. When a data link is robust enough and no more extra redundancy is needed, other types of data can be used to control antenna selection, such as security related data, (e.g., digital watermarking, security keys, or the like).

In the foregoing description, the punctured bits are used to select antennas for maximum code redundancy. However, the antenna selecting bits do not have to be stolen bits, and other data may be used for antenna selection.

If it is considered that a combined QAM mapper and an antenna selection switch as an inner coder and a convolutional coder as an outer coder, this is a serial concatenated code and turbo decoding applies. Associate antenna selection with a coded bit (preferably stolen bit, but not necessarily). When channel state information is known, the receiver can make an estimation which antenna was used to transmit therefore obtain added information on the stolen bit. The added redundancy on the stolen bit will improve decoder performance. When the transmitted bits are unknown, initial estimation on the stolen bit will be unreliable. This is why iterative decoding is necessary. As the number of iteration goes up, the receiver will have more reliable information on the transmitted bits, therefore, improve estimation on the stolen bits. This ultimately improves coding gain.

Since the stolen bits are random, each codeword will likely have bits transmitted from both antennas, like conventional antenna switching. When combined with channel coding, spatial diversity is achieved.

It should be noted that the system performance is not significantly affected when the channel state information of two different transmit antennas is similar. The effect is that log likelihood ratio (LLR) of stolen bits will be near zero, and will not affect decoder in either direction. However, when channel state information is significantly different, a reliable measure is achieved on the stolen bits and the greatest improvement in performance is achieved.

As a logic extension, more coding gain will be achieved when multiple receive antennas are used because of diversity on the stolen bits. It is more likely to observe two different vectors, (multiple receive antennas), than two different scalars, (single receive antenna).

The present invention can be applied to any wireless communication systems including, but not limited to, time division multiple access (TDMA), code division multiple access (CDMA), OFDM, single carrier-frequency division multiple access (SC-FDMA), MIMO, or the like. The present invention can be applied to both downlink and uplink.

Although the features and elements of the present invention are described in the preferred embodiments in particular combinations, each feature or element can be used alone without the other features and elements of the preferred embodiments or in various combinations with or without other features and elements of the present invention. The methods or flow charts provided in the present invention may be implemented in a computer program, software, or firmware tangibly embodied in a computer-readable storage medium for execution by a general purpose computer or a processor. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

A processor in association with software may be used to implement a radio frequency transceiver for use in a wireless transmit receive unit (WTRU), a user equipment (UE), a terminal, a base station, a radio network controller, or any host computer. The WTRU may be used in conjunction with modules, implemented in hardware and/or software, such as a camera, a video camera module, a videophone, a speakerphone, a vibration device, a speaker, a microphone, a television transceiver, a hands free headset, a keyboard, a Bluetooth® module, a frequency modulated (FM) radio unit, a liquid crystal display (LCD) display unit, an organic light-emitting diode (OLED) display unit, a digital music player, a media player, a video game player module, an Internet browser, and/or any wireless local area network (WLAN) module.

What is claimed is:

1. A wireless communication method comprising:
encoding incoming bits to generate coded bits;
puncturing the coded bits in accordance with a predetermined puncturing pattern to generate surviving channel bits and stolen bits;
interleaving the surviving bits into interleaved surviving bits;
mapping the interleaved surviving bits to generate channel symbols;
interleaving the stolen bits to generate interleaved stolen bits;
selecting at least one of a plurality of antennas to transmit the channel symbols based on the value of the interleaved stolen bits, wherein the channel symbols are transmitted via a first one of the antennas on a condition that the value of a stolen bit is zero or transmitted via a second one of the antennas on a condition that the value of a stolen bit is one.

2. The method of claim 1 further comprising:
simultaneously transmitting the same channel symbol via two of the antennas when the value of a stolen bit is zero; and
simultaneously transmitting a particular channel symbol via a first one of the antennas and an inverse of the particular channel symbol via a second one of the antennas when the value of a stolen bit is one.

3. The method of claim 1 further comprising:
splitting the channel symbols into multiple substreams; and
selecting respective ones of the plurality of antennas to transmit respective ones of the substreams.

4. A wireless communication method comprising:
receiving transmitted channel symbols;
estimating a posteriori probability for both surviving bits and stolen bits from the channel symbols;
retrieving information of the stolen bits by determining the selected antenna used to transmit the channel symbols;
calculating and generating extrinsic information associated with the surviving bits and the stolen bits by subtracting a priori probability from the posteriori probability;
deinterleaving the extrinsic information; and
refining information on the surviving bits and the stolen bits.

5. A transmitter comprising:
a channel encoder for encoding incoming bits to generate coded bits;
a puncturer for puncturing the coded bits in accordance with a predetermined puncturing pattern to generate surviving channel bits and stolen bits;
a first interleaver for interleaving the surviving bits into interleaved surviving bits;
a mapper for mapping the interleaved surviving bits to generate channel symbols;
a second interleaver for interleaving the stolen bits to generate interleaved stolen bits;
a plurality of antennas;
at least one antenna switch for selecting at least one of the plurality of antennas to transmit the channel symbols, wherein the channel symbols are transmitted via a first one of the antennas when the value of a stolen bit is zero, and the channel symbols are transmitted via a second one of the antennas when the value of a stolen bit is one.

6. The transmitter of claim 5 wherein the same channel symbol is simultaneously transmitted via two of the antennas when the value of a stolen bit is zero, and a particular channel symbol is transmitted via a first one of the antennas and an inverse of the particular channel symbol is transmitted via a second one of the antennas, simultaneously, when the value of a stolen bit is one.

7. The transmitter of claim 5 further comprising:
a multiplexer for splitting the channel symbols into multiple substreams; and
a plurality of antenna switches for selecting respective ones of the plurality of antennas to transmit respective ones of the substreams.

8. A receiver comprising:
at least one antenna for receiving channel symbols;
a radio frequency (RF) front end for processing the received channel symbols to generate samples;
a soft-in-soft-out (SISO) demapper for estimating a posteriori probability for both surviving bits and stolen bits from the channel symbols, retrieving information of the stolen bits by determining the selected antenna used to transmit the channel symbols, and calculating outputting extrinsic information associated with the surviving bits and the stolen bits by subtracting a priori probability from the posteriori probability;
a deinterleaver for deinterleaving the extrinsic information; and
a SISO decoder for refining information on the surviving bits and the stolen bits.

9. The receiver of claim 8, wherein the SISO decoder outputs a posteriori probability for information bits which is sent to a decision-making stage, and extrinsic bit probability information.

10. The receiver of claim 9 further comprising:
an interleaver for interleaving the extrinsic bit probability information, wherein the interleaved extrinsic bit probability information is fed back to the SISO demapper of an iterative basis.

11. An integrated circuit (IC) comprising:
at least one antenna for receiving channel symbols;
a radio frequency (RF) front end for processing the received channel symbols to generate samples;
a soft-in-soft-out (SISO) demapper for estimating posteriori probability for both surviving bits and stolen bits from the channel symbols, retrieving information of the stolen bits by determining the selected antenna used to transmit the channel symbols, and calculating outputting extrinsic information associated with the surviving bits and the stolen bits by subtracting a priori probability from the posteriori probability;
a deinterleaver for deinterleaving the extrinsic information; and
a SISO decoder for refining information on the surviving bits and the stolen bits.

12. An integrated circuit (IC) incorporated in a transmitter comprising a plurality of antennas, the IC comprising:
a channel encoder for encoding incoming bits to generate coded bits;
a puncturer for puncturing the coded bits in accordance with a predetermined puncturing pattern to generate surviving channel bits and stolen bits;
a first interleaver for interleaving the surviving bits into interleaved surviving bits;
a mapper for mapping the interleaved surviving bits to generate channel symbols;
a second interleaver for interleaving the stolen bits to generate interleaved stolen bits;
at least one antenna switch for selecting one of the plurality of antennas to transmit the channel symbols, wherein the channel symbols are transmitted via a first one of the antennas when the value of a stolen bit is zero, and the channel symbols are transmitted via a second one of the antennas when the value of a stolen bit is one.

13. A transmitter comprising:
a channel encoder for encoding incoming bits to generate coded bits;
a puncturer for puncturing the coded bits in accordance with a predetermined puncturing pattern to generate surviving bits and stolen bits;
a first interleaver for interleaving the surviving bits into interleaved surviving bits;
a serial to parallel (S/P) converter for converting the interleaved surviving bits into multiple streams of interleaved surviving bits;
a plurality of mappers, each mapper for mapping the streams of interleaved surviving bits to channel symbols;
a cyclic shifter/interleaver for cyclically shifting and interleaving the stolen bits;
a spatial mapper for mapping the channel symbols to spatial streams on a subcarrier by subcarrier basis in accordance with the cyclically shifted and interleaved stolen bits;
a plurality of inverse fast Fourier transform (IFFT) units, each IFFT unit for performing an IFFT on the spatial streams; and
a plurality of antennas for transmitting the spatial streams after the IFFT units perform an IFFT on the spatial streams.

14. An integrated circuit (IC) incorporated in a transmitter comprising a plurality of antennas, the IC comprising:
a channel encoder for encoding incoming bits to generate coded bits;
a puncturer for puncturing the coded bits in accordance with a predetermined puncturing pattern to generate surviving channel bits and stolen bits;
a first interleaver for interleaving the surviving bits into interleaved surviving bits;
a serial to parallel (S/P) converter for converting the interleaved surviving bits into multiple streams of interleaved surviving bits;

a plurality of mappers, each mapper for mapping the streams of interleaved surviving bits to channel symbols;

a cyclic shifter/interleaver for cyclically shifting and interleaving the stolen bits;

a spatial mapper for mapping the channel symbols to spatial streams on a subcarrier by subcarrier basis in accordance with the cyclically shifted and interleaved stolen bits; and a plurality of inverse fast Fourier transform (IFFT) units, each IFFT unit for performing an IFFT on the spatial streams for transmission by the antennas.

* * * * *